United States Patent [19]
Sugimoto

[11] Patent Number: 4,492,934
[45] Date of Patent: Jan. 8, 1985

[54] VOLTAGE CONTROLLED OSCILLATOR WITH LINEAR CHARACTERISTIC

[75] Inventor: Yasuhiro Sugimoto, Kawasaki, Japan

[73] Assignee: Tokyo Shibaura Denki Kabushiki Kaisha, Japan

[21] Appl. No.: 346,234

[22] Filed: Feb. 5, 1982

[30] Foreign Application Priority Data

Feb. 12, 1981 [JP] Japan .................. 56-19479

[51] Int. Cl.³ .................. H03B 5/04; H03B 5/12
[52] U.S. Cl. .................. 331/117 R; 331/168; 331/177 R
[58] Field of Search ........ 331/117 R, 117 FE, 177 R, 331/167, 168

[56] References Cited

U.S. PATENT DOCUMENTS

| | | | |
|---|---|---|---|
| 3,963,996 | 6/1976 | Skerlos | 331/117 R |
| 3,986,145 | 10/1976 | Hongu et al. | 331/177 R X |
| 4,061,987 | 12/1977 | Nagahama | 331/177 R X |
| 4,063,193 | 12/1977 | Wilcox | 331/117 R |
| 4,169,248 | 9/1979 | Hongu et al. | 331/117 R X |
| 4,270,102 | 5/1981 | Gawler et al. | 331/177 R X |

FOREIGN PATENT DOCUMENTS 0099805  7/1980  Japan .................. 331/117 R

OTHER PUBLICATIONS

Barnes, A. "L-C Oscillator With Stable Output Level" *New Electronics*, (6B) vol. 10, #10 (17 May 1977) p. 44.

Primary Examiner—Eugene R. LaRoche
Assistant Examiner—D. C. Mis
Attorney, Agent, or Firm—Finnegan, Henderson, Farabow, Garrett & Dunner

[57] ABSTRACT

A voltage controlled oscillator is provided with an LC parallel resonance circuit connected to the collector of one of a differential pair of transistors, and an amplifier and a capacitor which are connected between the collector of the one transistor and the base of the other transistor. The bases of the differential pair of transistors are equally biased. The emitters of the transistors are connected to a variable current source. The variable current source produces a current proportional to the square of control voltage. The frequency of the VCO can be changed by the control voltage with good linearity over a wide dynamic range. The variable current source causes the VCO characteristic to be linear. The value of the capacitor can be small, making the oscillator circuit well suited for integrated circuit fabrication.

5 Claims, 7 Drawing Figures

VOLTAGE CONTROLLED OSCILLATOR WITH LINEAR CHARACTERISTIC

BACKGROUND OF THE INVENTION

The present invention relates to an oscillator having a variable frequency capable of varying an oscillating frequency.

A voltage controlled oscillator as shown in FIG. 1 has been used as the variable frequency oscillator. As shown, control voltage terminals 10 and 12 are respectively connected to the bases of NPN transistors 14 and 16. The transistors 14 and 16, of which the emitters are connected together, make up a differential circuit. The emitters of the transistors 14 and 16 are both connected to a constant current source 18.

The collector of the transistor 14 is connected to the base of an NPN transistor 20 and to a bias terminal 24 by way of an LC parallel resonance circuit 22. The collectors of the transistors 16 and 20 are connected to the bias terminal 24. The emitter of the transistor 20 is connected to an output terminal 26 and a bias current source 28, and to the emitters of the transistors 14 and 16 via a capacitor 30.

In the prior oscillator, a combination of the LC resonance circuit 22 and the capacitor 30 provides a phase shift or $2n\pi$ (n: positive integer or 0) in a feedback loop, whereby allowing an oscillating signal to appear at the output terminal 26. Currents flowing through the differential pair of transistors 14 and 16 can be changed by changing a voltage applied between the control voltage terminals 10 and 12. The result is that the input impedance of the transistor 14 changes, a time constant given by the input impedance of the transistor 14 and the capacitance of the capacitor 30 changes, and consequently the oscillating frequency changes.

Since in the prior art the base voltages of the differential pair of transistors are controlled, the current flowing into one of the differential pair of transistors becomes zero if the voltage applied between the voltage terminals 10 and 12 reaches about 100 mV. It follows that the currents flowing in the differential pair of transistors are rendered constant if the voltage mentioned above exceeds 100 mV. Thus, a variable range of the control voltage is narrow which makes it difficult to set the oscillating frequency. The characteristic of an input impedance against the base voltage of the transistor is exponential. For this reason, a relationship of the control voltage between oscillating frequency has a poor linearity. In this respect, difficulty is again encountered in controlling the oscillating frequency. For operating the oscillator at a low frequency, the capacitance of the phase shifting capacitor 30 must be large. This must be avoided in fabricating the oscillator by integrated circuit technology.

SUMMARY OF THE INVENTION

Accordingly, the present invention has an object to provide an oscillator having a wide dynamic range of the control voltage, a good linearity of the oscillating frequency against the control voltage, and a good adaptability for the integrated circuit fabrication.

The present invention is achieved by an oscillator comprising first and second bias terminals, a first transistor of which the base and collector are respectively connected to the first and second bias terminals, a second transistor of which the base and emitter are respectively connected to the first bias terminal and the emitter of the first transistor, a variable current source connected to the emitters of the first and second transistors, a resonance circuit connected between the collector of the second transistor and the second bias terminal, and a feedback path having an amplifier and a capacitor connected between the collector of the second transistor and the base of the first transistor.

DETAILED DESCRIPTION OF THE PREFERRED EMBODIMENT

Figure 1:
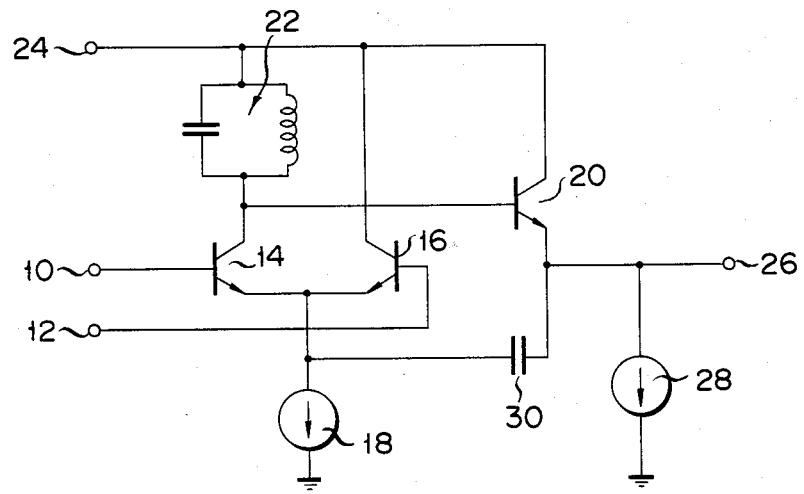
FIG. 1 shows a circuit diagram of the prior art voltage controlled oscillator.
Figure 2:
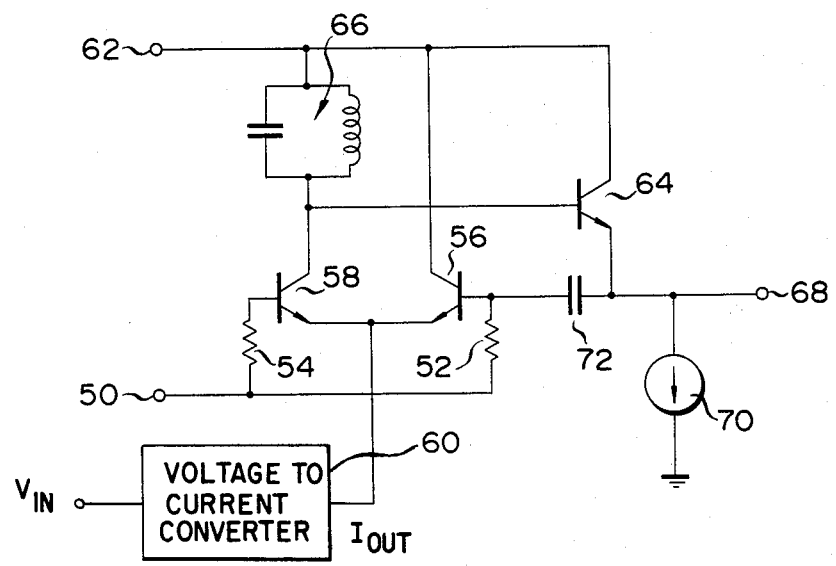
FIG. 2 shows a circuit diagram of an embodiment of an oscillator according to the present invention.

An embodiment of a voltage controlled oscillator according to the present invention will be described referring to the accompanying drawings. FIG. 2 shows its circuit diagram. A bias terminal 50 is connected through resistors 52 and 54 to the bases of NPN transistors 56 and 58, respectively. Preferably, resistances of the resistors 52 and 54 are equal to each other. The emitters of the transistors 56 and 58 are connected together, with the connection point further connected to a variable current source 60. The collector of the transistor 56 is connected to a bias terminal 62. The collector of the transistor 58 is connected to the bias terminal 62 via an LC parallel resonance circuit 66 and also to the base of an NPN transistor 64. The transistor 64 is connected at the collector to the bias terminal 62 and at the emitter to an output terminal 68 and a bias current source 70 and further to the base of the transistor 56 through a phase shift capacitor 72.

In the present embodiment, an oscillating signal is obtained through a feedback loop containing the transistor 64, the capacitor 72, and the transistors 56 and 58. The operation of the feedback loop will be described referring to its equivalent circuit of FIG. 3. The equivalent circuit is depicted on the assumption that the feedback loop is cut off at the base of the emitter follower transistor 64. In the circuit, $\beta$, $\alpha$, and Re represent a current gain, a current transistor ratio and an AC emitter resistance, respectively.

Assuming that $\beta$ is much greater than 1, an impedance of the base of the transistor 56 viewed from the connection point between the capacitor 72 and the resistor 52 is equivalently $2\beta Re$. Therefore, the base voltage Vb and base current Ib2 of the transistor 56, and the base current Ib1 of the transistor 58 are:

$$Vb = \frac{R//2\beta Re}{(R//2\beta Re) + \frac{1}{j\omega C}} Vi \quad (1)$$

-continued $$Ib2 = \frac{Vb}{2\beta Re} \quad (2)$$

$$Ib1 \approx \beta Ib2 \quad (3)$$

where
Vi=input voltage of the capacitor 72
R=resistance of the resistor 52
C=capacitance of the capacitor 72.
When arranging Eq. (1) to (3), we have $$Ib1 = \frac{R//2\beta Re}{(R//2\beta Re) + \frac{1}{j\omega C}} \times \frac{Vi}{2R} = \quad (4)$$

$$= \frac{1}{2Re + \frac{R + 2\beta Re}{j\omega \beta CR}} Vi$$

Assuming that $$X = \frac{\omega}{\omega_o} - \frac{\omega_o}{\omega} \approx \frac{\omega - \omega_o}{\omega_o} \quad (5)$$

an impedance Z of the LC resonance circuit 66 is given by $$Z = \frac{r}{1 + 2jQX} \quad (6)$$

where r is a resistance of the resonance circuit 66 and Q is a selectivity of the same circuit.

An amplification degree Av of the feedback loop is $$Av = \frac{Vo}{Vi} = \alpha Ib1 \times \frac{r}{1 + 2jQX} = \quad (7)$$

$$\frac{\alpha r}{(1 + 2jQX)\left(2Re + \frac{R + 2\beta Re}{j\omega \beta CR}\right)} =$$

$$\alpha r / \left[\left\{2Re + \frac{(R + 2\beta Re) \times 2QX}{\omega \beta CR}\right\} + j\left(4ReQX - \frac{R + 2\beta Re}{\omega \beta CR}\right)\right]$$

where Vo is an output voltage of the resonance circuit 66.

Figure 3:
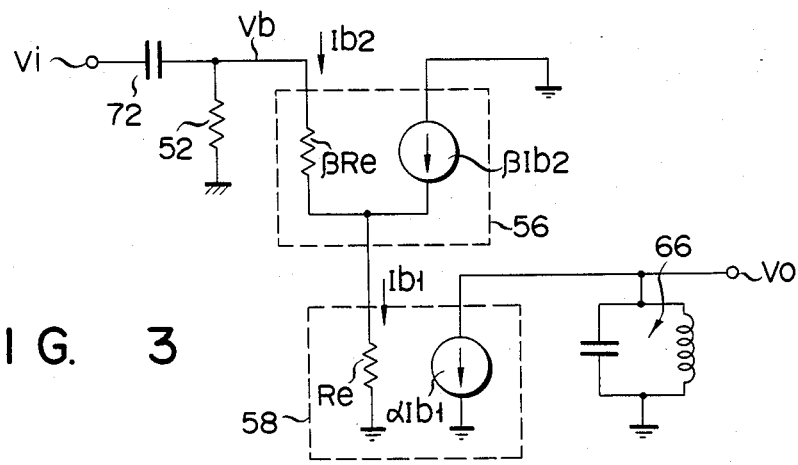
FIG. 3 shows an equivalent circuit diagram of the oscillator of FIG. 2.

Actually, the Vi input terminal and the Vo output terminal in FIG. 3 are connected in the feedback loop. Therefore, by neglecting the imaginary term in Eq. (7), an oscillating condition in the feedback loop is given by $$4ReQX = \frac{R + 2\beta Re}{\omega \beta CR} \quad (8)$$

Substituting Eq. (5) into Eq. (8) and arranging the resultant equation for an oscillating angular frequency $\omega$, the following equation is obtained:

$$\omega^2 - \omega_o \omega - \frac{R + 2\beta Re}{4\beta ReCRQ} \omega_o = 0 \quad (9)$$

When using the positive term in the solution of Eq. (9), the oscillating angular frequency $\omega$ is given by $$\omega = \frac{\omega_o}{2} + \frac{\omega_o}{2}\sqrt{1 + \frac{R + 2\beta Re}{(\beta C)ReRQ\omega_o}} = \quad (10)$$

$$\frac{\omega_o}{2} + \frac{\omega_o}{2}\sqrt{1 + \frac{2}{CRQ\omega_o} + \frac{1}{\beta CReQ\omega_o}}$$

The AC emitter resistor Re is $$Re = \frac{kT}{q\frac{I}{2}} = \frac{2kT}{qI} \quad (11)$$

When substituting Eq. (11) into Eq. (10), the oscillating angular frequency $\omega$ is $$\omega = \frac{\omega_o}{2} + \frac{\omega_o}{2}\sqrt{1 + \frac{2}{CRQ\omega} + \frac{qI}{\beta C2kTQ\omega_o}} = \quad (12)$$

$$\frac{\omega_o}{2} + \frac{\omega_o}{2}\sqrt{1 + A + BI}$$

Where A and B are each constant.

Figure 4:
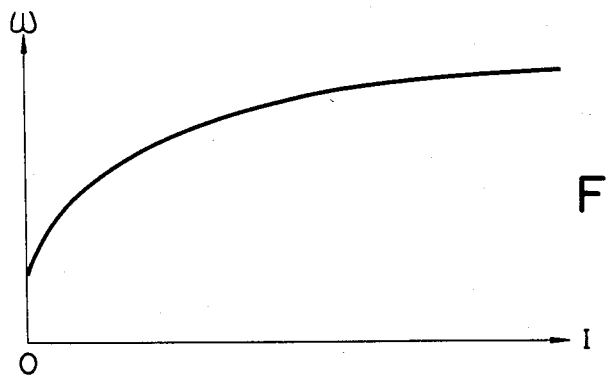
FIG. 4 is a graph showing a current vs. oscillating frequency characteristic of the embodiment shown in FIG. 2.

As seen from Eq. (12), the circuit shown in FIG. 2 operates as an oscillator of which the oscillating frequency is changed by changing the current I of the variable current source 60. The third term in the root sign of Eq. (12) shows that the phase shift capacitor C is equivalently multiplied by $\beta$. This implies that even if the capacitance of the phase shift capacitor C is small, a stable oscillation is ensured at a relatively low frequency. Therefore, the oscillator of the present embodiment is well adaptable for the IC fabrication. The current vs. frequency characteristic mathematically expressed by Eq. (12) may be plotted, as in FIG. 4. As seen, the oscillating angular frequency $\omega$ changes against the current I along a square root curve, not a linear curve.

Figure 5:
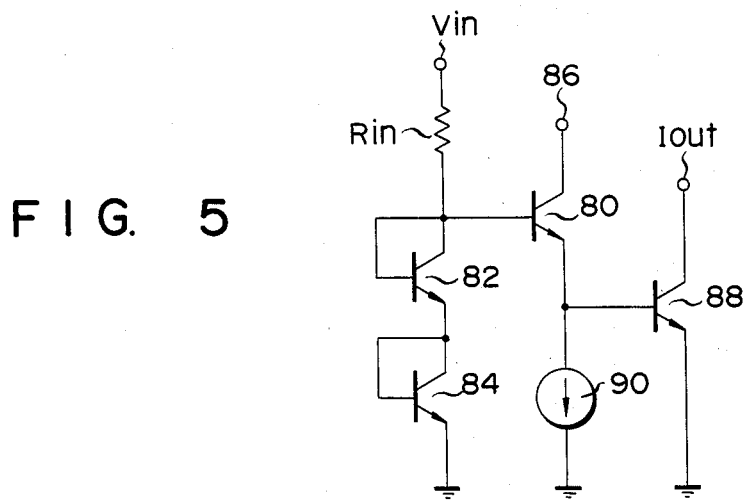
FIG. 5 shows a circuit diagram of a variable current source used in the embodiment of FIG. 2.

The improvement of the linearity of the embodiment shown in FIG. 2 is realized by designing the variable current source 60 so as to enable the output current I to be proportional to the square of the voltage V applied ($I \propto V^2$). An example of the variable current source 60 thus designed is shown in FIG. 5. As shown, the control voltage Vin is coupled with the base of an NPN transistor 80, through an input resistor Rin. The base of the transistor 80 is grounded through a series path of NPN transistors 82 and 84 each connected in a diode fashion. The collector of the transistor 80 is connected to a bias terminal 86. The transistor 80 is further connected at the emitter to the base of an NPN transistor 88 and a bias current source 90. The emitter of the transistor 88 is grounded, so that the collector current serves as an output current Iout from the current source. In the voltage—current converting circuit shown in FIG. 5, the output current Iout is proportional to the square of the input current, and is expressed by $$Iout = D\left(\frac{Vin}{Rin}\right)^2 \quad (13)$$

where D is a constant. Substituting Eq. (13) into Eq. (12), Eq. (12), if $1 + A < BI$, is rewritten into $$\omega = \frac{\omega_o}{2} + \frac{\omega_o}{2}\sqrt{BD\left(\frac{V_{in}}{R_{in}}\right)^2} = \quad (14)$$

$$\frac{\omega_o}{2} + \frac{\omega_o}{2}\sqrt{BD}\left(\frac{V_{in}}{R_{in}}\right)$$

This equation teaches that the oscillator shown in FIG. 2 provides an oscillating angular frequency ω linearly changing against the control voltage Vin, if the current source exhibiting the square characteristic against the control voltage is used for the current source of the oscillator. Eq. (14) further teaches that the dynamic range of the control voltage Vin may be set at a proper range by changing the input resistance Rin. This implies that the oscillating frequency may easily be changed by widening the dynamic range of the control voltage.

Figure 6:
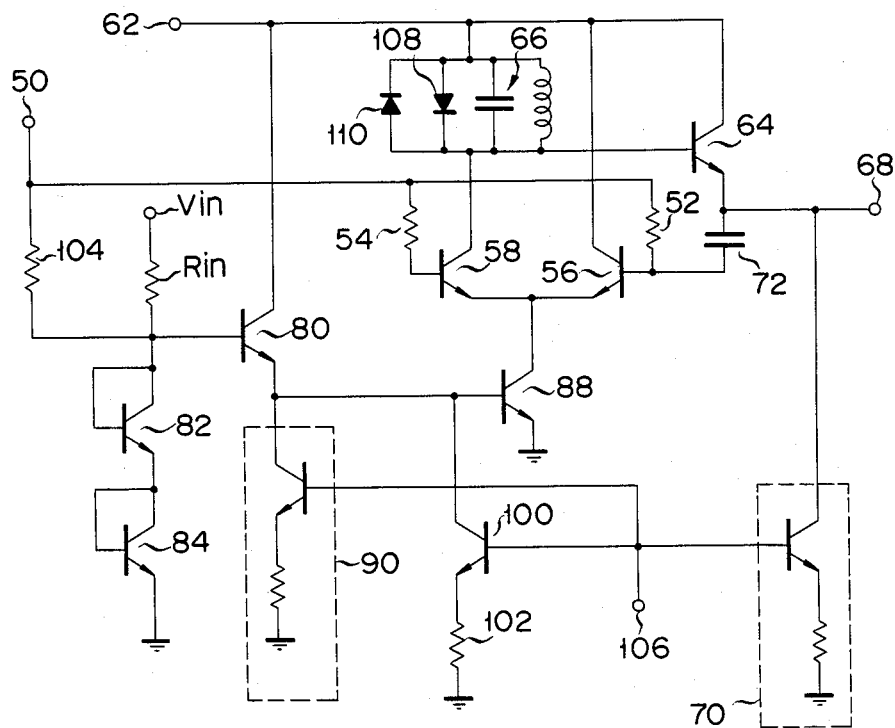
FIG. 6 shows a circuit diagram of a practical voltage controlled oscillator which is constructed by combining the circuits of FIGS. 2 and 5.

A practical arrangement of the oscillator when the current source shown in FIG. 5 is used, is illustrated in FIG. 6. The practical arrangement of FIG. 6 is a local oscillator in an AM radio receiver of which the intermediate frequency is 455 kHz. In the figure, same numerals are used for designating like portions in FIGS. 2 and 5. A transistor 100, and resistors 102 and 104 are used for setting an initial value of the current of the variable current source transistor 88. A terminal 106 is a bias terminal. The LC parallel resonance circuit 66 is connected with diodes 108 and 110 for amplitude limiting.

Figure 7:
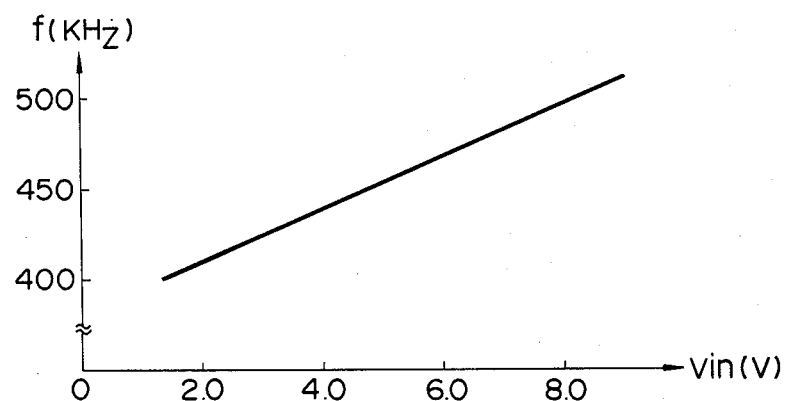
FIG. 7 is a graph showing a voltage vs. oscillating frequency characteristic of the voltage controlled oscillator shown in FIG. 6.

A control voltage vs. oscillating frequency characteristic with a good linearity is illustrated in FIG. 7. The characteristic curve shown in FIG. 7 was obtained when the circuit shown in FIG. 6 is designed with the specifications: the resonance frequency of the LC parallel resonance circuit 66 is 455 kHz, the phase shift capacitor 72 is 10 pF, the resistors 52 and 54 are 9.1 KΩ, and the input resistor Rin is 12 KΩ.

As described above, according to the present invention, there is provided an oscillator in which the oscillating frequency can be changed by the control voltage with a good linearity, and the dynamic range of the control voltage can be wide. In this embodiment, the capacitance of the phase shift capacitor can be small, making the oscillator circuit well suited for the integrated circuit fabrication.

What is claimed is:

1. An oscillator comprising:
    first and second bias terminals;
    a first transistor whose base and collector are connected to said first and second bias terminals, respectively;
    a second transistor whose base and emitter are connected to said first bias terminal and the emitter of said first transistor, respectively;
    voltage-to-current converter means for generating a current proportional to the square of an input voltage, wherein said voltage-to-current converter generating means is connected to the emitters of said first and second transistors;
    a resonance circuit connected between the collector of said second transistor and said second bias terminal; and
    a feedback path, having an amplifier and a capacitor, connected between the collector of said second transistor and the base of said first transistor.

2. The oscillator, according to claim 1, in which: said first and second transistors are of the same type; said amplifier includes a third transistor of the same type as that of said first and second transistors whose base is connected to the collector of said second transistor and whose collector is connected to said second bias terminal, said capacitor being connected between the emitter of said third transistor and the base of said first transistor, and a bias current source connected to the emitter of said third transistor; and an output terminal is connected to the emitter of said third transistor.

3. The oscillator according to claim 2, in which said first to third transistors are of NPN type.

4. The oscillator according to claim 2, in which said resonance circuit is an LC parallel resonance circuit.

5. The oscillator according to claim 1 wherein said voltage-to-current converter generating means varies the oscillator frequency linearly proportional to said input voltage.

* * * * *